United States Patent [19]

Fasano

[11] Patent Number: 4,582,379
[45] Date of Patent: Apr. 15, 1986

[54] TEST SHOE FOR TELEPHONE CONNECTOR BLOCKS

[75] Inventor: Michael Fasano, Syosset, N.Y.

[73] Assignee: Porta Systems Corp., Syosset, N.Y.

[21] Appl. No.: 157,361

[22] Filed: Jun. 9, 1980

[51] Int. Cl.[4] ............................................. H01R 13/62
[52] U.S. Cl. .................................................. 339/45 M
[58] Field of Search ................. 339/45 R, 45 M, 45 T

[56] References Cited

U.S. PATENT DOCUMENTS 4,193,656  3/1980  Ward ................................ 339/45 M

FOREIGN PATENT DOCUMENTS 712981  1/1980  U.S.S.R. ........................... 339/45 M

Primary Examiner—Joseph H. McGlynn
Attorney, Agent, or Firm—Charles E. Temko

[57] ABSTRACT

A test shoe adapted to engage a discrete area on a telephone connector block, normally mounted upon a telephone main frame for the purpose of interfacing with a plurality of individual subscriber circuits appearing on the block, either directly, or through protector modules. The establishment of communication with each subscriber circuit involves the engagement of a large number of contact prongs with corresponding circuits, creating substantial frictional contact tending to retain the shoe in position. Means is provided for facilitating the disengagement of the shoe after completion of testing procedures, whereby the friction is conveniently overcome, and the shoe disengaged in a direction perpendicular to the plane of the connector block.

3 Claims, 3 Drawing Figures

TEST SHOE FOR TELEPHONE CONNECTOR BLOCKS

BACKGROUND OF THE INVENTION

This invention relates generally to the field of telephony, and more particularly to an improved test shoe adapted to be placed in engagement with the exposed ends of subscriber pair cables appearing on a telephone connector or protector block.

As is known in the art, to afford protection to office switching and other equipment, it is common practice to bring individual subscriber pair cables into the office for appearance on a main frame having a plurality of connector and protector blocks. The latter are engaged by so called protector modules which complete the tip and ring circuits to the switching equipment, the modules including a variety of protective devices which ground excessive currents caused by the occurrence of lightning strikes, fallen cables and the like. When installation of new subscriber circuits is made, it is convenient to serially test a large number of such circuits using standard procedures by interfacing the test equipment at the point where the protector modules are subsequently connected. With the development of protector modules having test points on an exposed surface thereof, it is desirable that the same test shoe engage either such points or the contacts appearing on the protector block.

It is also known in the art to provide large test shoes for this purpose, capable of simultaneously engaging up to one hundred subscriber pairs, the engagement of each pair requiring terminal interconnection for tip and ring circuits, as well as ground. Engagement is made by the penetration of spring urged projections into corresponding oversized sockets, and once engaged, the shoe is maintained, in some constructions, by the provision of a latching means which contacts a portion of the main frame. Because of the large number of contacts made, considerable frictional force is developed when an attempt is made to remove the shoe after the completion of test procedures, and difficulty in overcoming this frictional force is often encountered. The above described structure is usually bulky, not inexpensive to manufacture, and, because of its size, not always convenient to use.

SUMMARY OF THE INVENTION

Briefly stated, the invention contemplates the provision of an improved test shoe of the class described of somewhat smaller dimensions which may be used singly or in conjunction with similar shoes to cover the entire surface of a protector block, and which includes self-contained means for facilitating disconnection of the shoe from the protector block using relatively modest manually applied force, requiring only the thumb and fingers of service personnel. The block is of relatively elongated configuration, and is provided with a plunger at each end thereof having projections for applying pressure at points located between certain of the contact pins to start disengaging movement between the block and the shoe.

BRIEF DESCRIPTION OF THE DRAWING

In the drawing, to which reference will be made in the specification, similar reference characters have been employed to designate corresponding parts throughout the several views.

DETAILED DESCRIPTION OF THE DISCLOSED EMBODIMENT

Figure 1:
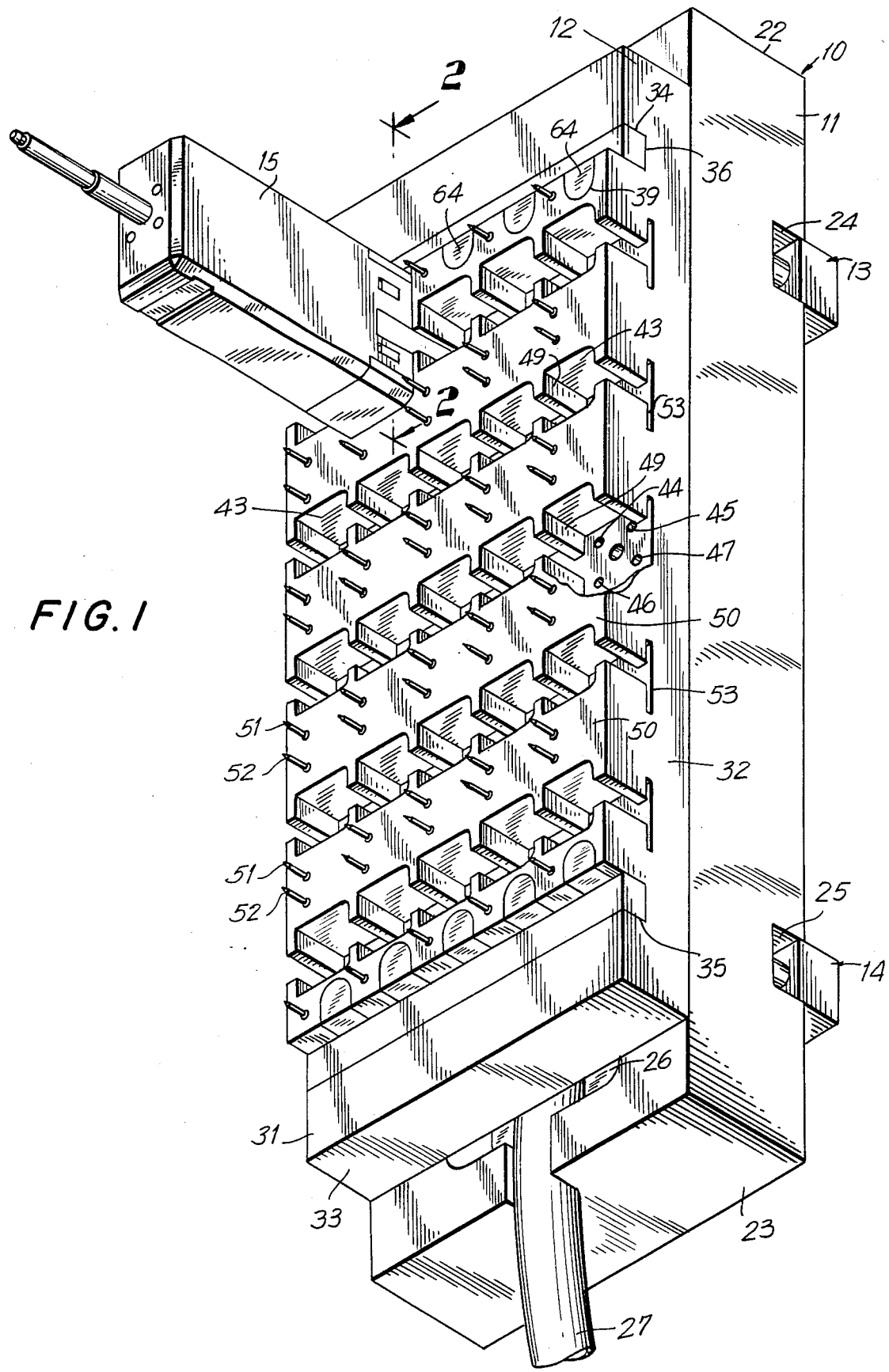
FIG. 1 is a fragmentary view in perspective of an embodiment of the invention.
Figure 2:
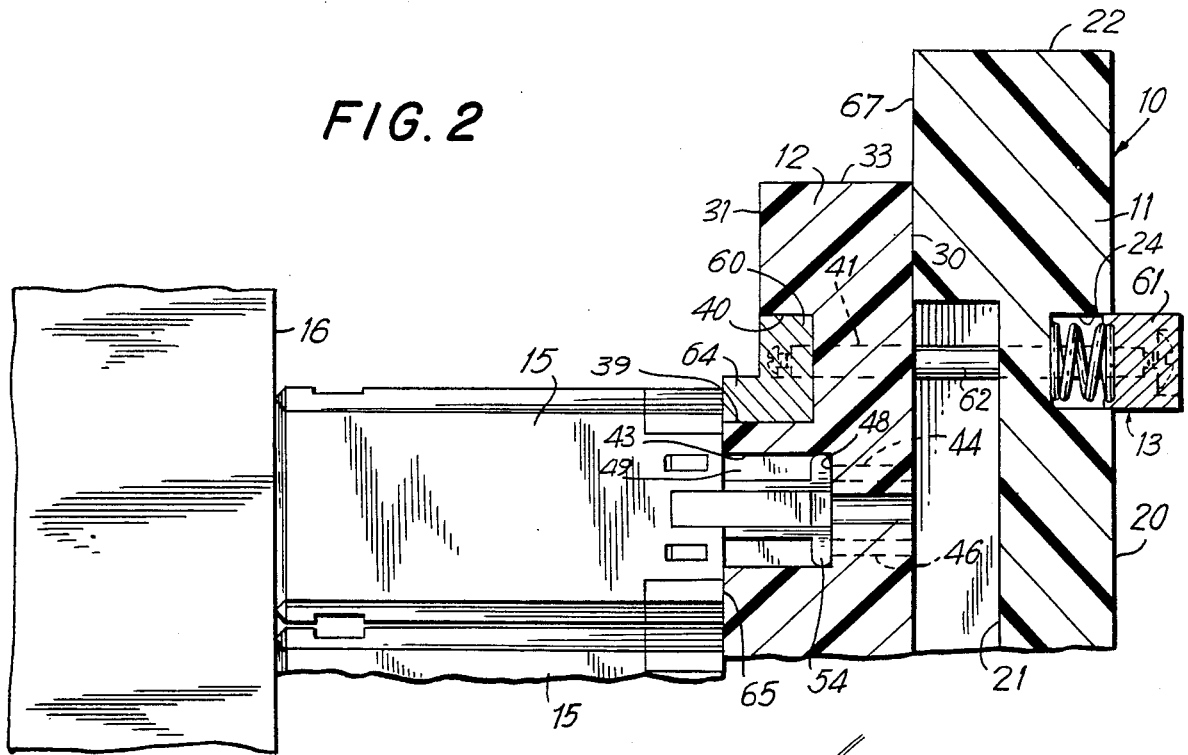
FIG. 2 is a side elevational view of the embodiment, showing the same in engaged condition with a plurality of protector modules in turn engaged upon a protector block.
Figure 3:
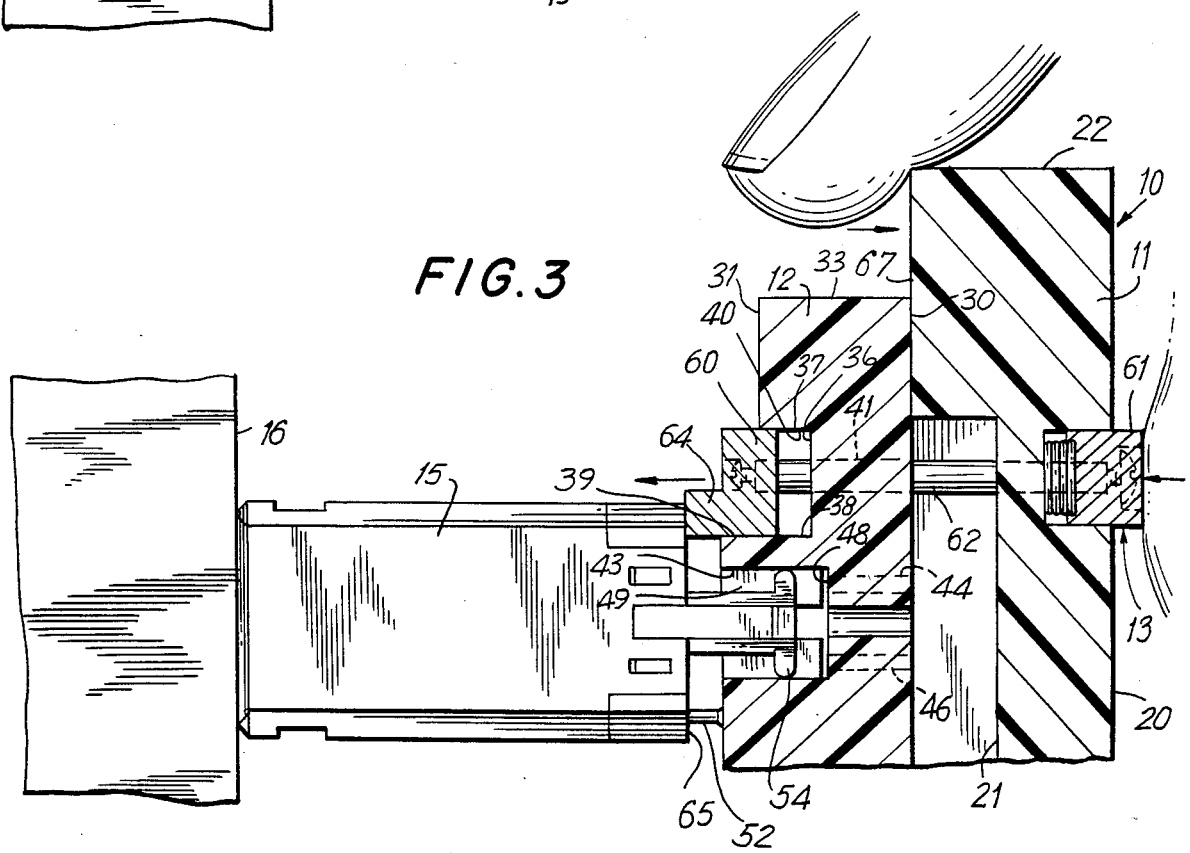
FIG. 3 is a similar side elevational view showing the operation of manually operated disengaging means.

In accordance with the invention, the device, generally indicated by reference character 10, comprises broadly an elongated main body element 11, a protector module engaging element 12, and first and second disconnecting means 13 and 14, respectively. As seen in FIGS. 2 and 3, the block is illustrated as interconnectable with the exposed ends of plural protector modules 15 of known type.

The main body element 11 is preferably formed as a casting or injection molding of insulated synthetic resinous materials, and is bounded by an outer wall 20, an inner wall 21, end walls 22 and side walls 23. The outer wall 20 is provided with first and second transverse recesses 24 and 25 accommodating the means 13 and 14, respectively, and the inner wall 21 is provided with a relatively large rectangular recess 26 to accommodate the end segments of test conductors, usually in the form of a single cable 27.

The module engaging element 12 may also be formed as an injection molding, and is bounded by an outer surface 30, an inner surface 31, side surfaces 32 and end surfaces 33. The outer surface 30 defines first and second transverse recesses 34 and 35, respectively, each including a bottom wall 36, an outer side wall 37, and an inner side wall 38 having small arcuate recesses 39 therein at substantially uniform intervals. The end ones 40 of the recesses 39 are provided with bores 41 slideably accommodating interconnecting screws forming parts of the means 13 and 14.

The outer surface also defines a plurality of generally rectangular recesses 43 arranged in rank and file, adapted to accommodate the manually engageable handles of the protector modules 15. Conductive sockets 44, 45, 46 and 47 are also provided in a bottom wall 48 for use in completing test circuits when the device 10 is applied directly to a protector block 16 in the absence of protector modules 15. The recesses 43 are formed by longitudinally extending septums 49 and transversely extending septums 50, the base portions of which are grooved 53 to resiliently engage the ends 54 of the handle portions of the modules with a snap-like action. Positioned in the transversely extending septums 50 are first and second sets of resilient pins 51 and 52, respectively on either side of the recesses to provide for contact with exposed test points on the modules.

The first and second means 13 and 14 are similar, and symetrically positioned. Each includes a block engaging member 60 and a manually engageable member 61 interconnected by threaded means 62. The block engaging member 60 includes projections 64 slideably positioned in the recesses 39, the exposed ends of which are adapted to overlie portions 65 of the outer surfaces of the module 16.

When disengagement of the device 10 from an engaged plurality of modules is desired, it is necessary only to grasp the surface 67 with the fingers, and press inwardly on the exposed surface of the member 61 at each end of the main body element 11. The means 13 and 14 then act as plungers and dislodge the resilient purchase of the recesses 43, thereby facilitating the sliding movement necessary to accomplish total disengagement.

I wish it to be understood that we do not consider the invention limited to the precise details of structure shown and set forth in this specification, for obvious modifications will occur to those skilled in the art to which the invention pertains.

I claim:

1. Improved test shoe construction for use with a telephone circuit protector block having a plurality of protector modules engaged thereon, said modules each presenting an outer planar surface having exposed test points, and a manually engageable handle projecting outwardly from said planar surface, said shoe construction comprising a main body element of generally planar configuration adapted to overlie a substantial number of said modules, said body element including a recess therein for the accommodation of plural leads extending to test equipment; a module engaging element of generally planar configuration corresponding to that of said main body element, and overlying said recess in said main body element, said module engaging element having an exposed surface defining plural recesses corresponding in size and location to the manually engageable handle members of said protector modules, the surfaces defining said recess exerting a resilient purchase on corresponding surfaces of said handle members; said module engaging element having resilient contacts corresponding in size and location to the test points on said modules to effect contact with said test points upon engagement of said handle members within said recesses; said shoe construction including manually operated plunger means selectively exerting pressure against said planar surfaces of said modules to disengage the resilient purchase of the walls forming said recesses upon said handle engaging members, thereby facilitating disconnection between said modules and said recesses.

2. Improved construction in accordance with claim 1, further characterized in said plunger means being positioned adjacent a pair of opposed ends of said main body element, and having a first member projecting outwardly from an exposed surface of said main body member, and a second member having projections selectively engaging said planar surfaces of said modules between said test points.

3. Improved construction in accordance with claim 2, further characterized in said main body element defining a manually engageable surface which may be engaged by the fingers of a user, while simultaneously pressing said plunger means with the thumb of said user.

* * * * *